(12) United States Patent
Lin

(10) Patent No.: US 9,236,360 B2
(45) Date of Patent: Jan. 12, 2016

(54) IC CHIP PACKAGE AND CHIP-ON-GLASS STRUCTURE USING THE SAME

(71) Applicant: NOVATEK MICROELECTRONICS CORP., Hsinchu (TW)

(72) Inventor: Tai-Hung Lin, Hsinchu (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 281 days.

(21) Appl. No.: 13/650,873

(22) Filed: Oct. 12, 2012

(65) Prior Publication Data

US 2013/0093081 A1    Apr. 18, 2013

Related U.S. Application Data

(60) Provisional application No. 61/546,094, filed on Oct. 12, 2011.

(30) Foreign Application Priority Data

May 22, 2012   (TW) .............................. 101118218 A

(51) Int. Cl.
*H01L 23/48*     (2006.01)
*H01L 23/00*     (2006.01)
(Continued)

(52) U.S. Cl.
CPC ................. *H01L 24/13* (2013.01); *H01L 24/11* (2013.01); *H01L 24/73* (2013.01); *H01L 24/92* (2013.01); *H01L 21/6836* (2013.01); *H01L 23/544* (2013.01); *H01L 24/29* (2013.01); *H01L 24/81* (2013.01); *H01L 24/83* (2013.01);

(Continued)

(58) Field of Classification Search
CPC ........ H01L 23/544; H01L 24/29; H01L 24/92
USPC .......................................... 257/737, E21.502
See application file for complete search history.

(56) References Cited

U.S. PATENT DOCUMENTS

2008/0211092 A1    9/2008  Lu
2011/0101526 A1*   5/2011  Hsiao et al. ................... 257/738
(Continued)

FOREIGN PATENT DOCUMENTS

CN    102054811 A    5/2011
JP    2009-027173 A  2/2009
(Continued)

OTHER PUBLICATIONS

Taiwanese Office Action dated on Aug. 15, 2014.
(Continued)

*Primary Examiner* — Matthew W Such
*Assistant Examiner* — Krista Soderholm
(74) *Attorney, Agent, or Firm* — Rabin & Berdo, P.C.

(57) ABSTRACT

An IC chip package and a chip-on-glass structure using the same are provided. The IC chip package includes an IC chip having a circuit surface, and plural copper (Cu) bumps formed on the circuit surface. Moreover, a non-conductive film (NCF) could be formed on the circuit surface to cover the Cu bumps. The chip-on-glass structure includes a glass substrate, plural electrodes such as aluminum (Al) electrodes formed on the glass substrate, and a conductive film formed on the electrodes. The conductive film contains a number of conductive particles. When the IC chip package is coupled to the glass substrate, the Cu bumps can be coupled to the corresponding electrodes via conductive particles.

33 Claims, 9 Drawing Sheets

(51) Int. Cl.
  *H01L 23/544* (2006.01)
  *H01L 21/683* (2006.01)
(52) U.S. Cl.
  CPC .............. *H01L2224/1184* (2013.01); *H01L 2224/11845* (2013.01); *H01L 2224/13083* (2013.01); *H01L 2224/13144* (2013.01); *H01L 2224/13147* (2013.01); *H01L 2224/13155* (2013.01); *H01L 2224/27416* (2013.01); *H01L 2224/27848* (2013.01); *H01L 2224/293* (2013.01); *H01L 2224/2919* (2013.01); *H01L 2224/2929* (2013.01); *H01L 2224/29499* (2013.01); *H01L 2224/73204* (2013.01); *H01L 2224/81191* (2013.01); *H01L 2224/81201* (2013.01); *H01L 2224/81424* (2013.01); *H01L 2224/81903* (2013.01); *H01L 2224/8385* (2013.01); *H01L 2224/83191* (2013.01); *H01L 2224/83192* (2013.01); *H01L 2224/83193* (2013.01); *H01L 2224/83851* (2013.01); *H01L 2224/9211* (2013.01); *H01L 2224/94* (2013.01); *H01L 2924/15788* (2013.01)

(56) References Cited

U.S. PATENT DOCUMENTS

2012/0018880 A1* 1/2012 Wu et al. .............. 257/737
2012/0281376 A1* 11/2012 Koyama et al. ........ 361/762

FOREIGN PATENT DOCUMENTS

| TW | 200724272 A | 7/2007 |
| TW | 200742013 A | 11/2007 |
| TW | 200916879 A | 4/2009 |
| WO | WO 2011078114 A1 | 6/2011 |

OTHER PUBLICATIONS

Chinese Office Action dated Dec. 1, 2014.

* cited by examiner

IC CHIP PACKAGE AND CHIP-ON-GLASS STRUCTURE USING THE SAME

This application claims the benefits of U.S. provisional application Ser. No. 61/546,094, filed Oct. 12, 2011, and Taiwan application Serial No. 101118218, filed May 22, 2012, and the subject matters of which are incorporated herein by reference.

BACKGROUND OF THE INVENTION

1. Field of the Invention

The invention relates in general to an IC (Integrated circuit) chip package and its application, and more particularly to an IC chip package having Cu bumps and a chip-on-glass structure using the same.

2. Description of the Related Art

The electrical transfer between an IC chip and a glass substrate is normally implemented by metal bumps, and the existing metal bumps are formed by gold (Au). The metal bumps are formed during the packaging process. Actual drawings illustrating the methods and routes regarding the connection of metal bumps are obtained by the software of package design. The material and hardness of the metal bumps are restricted by the requirements of the packaging process. On the other hand, the material and hardness of the metal bumps have effect on the electrical performance of the metal bumps after having been connected to the glass substrate.

SUMMARY OF THE INVENTION

The invention is directed to an IC chip package and a chip-on-glass structure using the same. The method of forming Cu bumps in the packaging process not only reduces the manufacturing cost but also produces suitable physical and electrical performance in a compression process (coupling to the glass substrate).

According to an embodiment of the present invention, an IC chip package is provided. The IC chip package includes an IC chip having a circuit surface, and plural copper (Cu) bumps disposed on the circuit surface. Moreover, a non-conductive film (NCF) could be formed on the circuit surface to cover the Cu bumps.

According to another embodiment of the present invention, a chip-on-glass structure is provided. The chip-on-glass structure includes a glass substrate, plural aluminum (Al) electrodes formed on the glass substrate, a conductive film formed on the glass substrate, an IC chip having a circuit surface, and plural Cu bumps disposed on the circuit surface. The conductive film, such as an anisotropic conductive film (ACF), contains a number of conductive particles and coves the Al electrodes. The top surfaces of the Cu bumps are electrically connected to the corresponding Al electrodes via a part of the conductive particles. Similarly, an NCF can be formed on the IC chip to cover the Cu bumps.

According to an alternative embodiment of the present invention, another IC chip package is provided. The IC chip package includes an IC chip having a circuit surface, plural Cu bumps disposed on the circuit surface, and an NCF formed on the circuit surface. The NCF is translucent and covers the Cu bumps formed by an alloy or a multi-layered structure. A copper component of the Cu bumps is 30 wt %~100 wt % of a total mass.

The above and other aspects of the invention will become better understood with regard to the following detailed description of the preferred but non-limiting embodiment(s). The following description is made with reference to the accompanying drawings.

DETAILED DESCRIPTION OF THE INVENTION

First Embodiment

Figure 1:
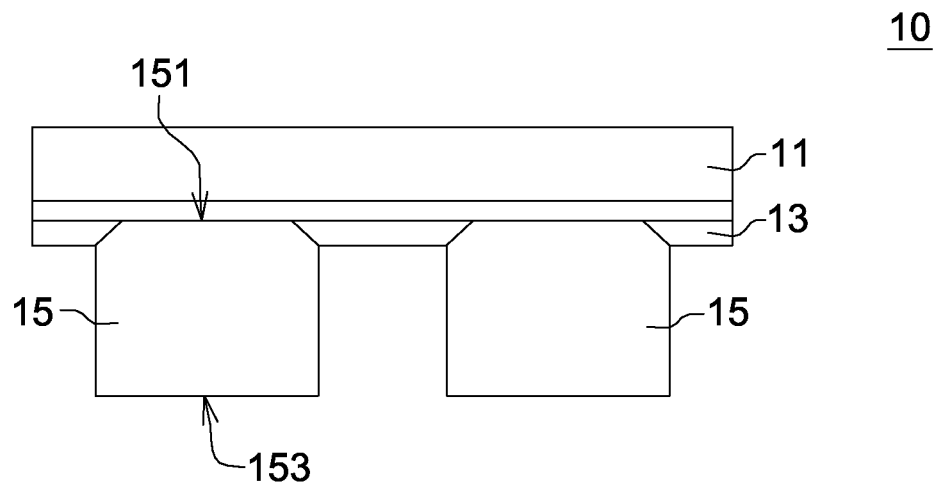
FIG. 1 shows a schematic diagram of an IC chip package according to the first embodiment of the invention.

Referring to FIG. 1, a schematic diagram of an IC chip package according to the first embodiment of the invention is shown. The IC chip package 10 at least includes an IC chip 11 and plural Cu bumps 15. The IC chip 11 has a circuit surface 13, and the bottom surfaces 151 of the Cu bumps 15 contact the circuit surface 13.

Take a glass substrate for example. When the IC chip package 10 used in a product is connected to the glass substrate, the top surfaces 153 of the Cu bumps 15 could be aligned with the corresponding electrodes disposed on the glass substrate, and the Cu bumps 15 could be electrically connected to the electrodes via the conductive particles contained in the conductive film disposed on the glass substrate to achieve electrical transferring between the IC chip 11 and the panel components.

In an embodiment, the Cu bumps are formed by pure copper with more than 99 wt % of a total mass, or formed with a copper component more than 90 w % of a total mass. Besides, the Cu bumps could be formed by an alloy or a multi-layered structure whose copper component is 30 wt %~100 wt % of a total mass. When the Cu bumps are realized by a Cu/Ni/Au multi-layered structure, the thickness of the Cu/Ni/Au multi-layered structure is such as 9/1/4 μm, 9/1/2 μm 7/1/4 μm, or other ratios.

Regarding the actual process of forming the IC chip package 10, the Cu bumps 15 may be directly electrically connected to the Al electrodes (such as ITO) disposed on the glass substrate within a short period of time (such as within a few hours) to avoid copper oxidation and copper ions migration. Besides, the process of forming the Cu bumps may further include procedures for inhibiting the growth of the oxidization layer or directly removing the oxidization layer. The growth of the oxidization layer may be inhibited by purging nitrogen during formation of the Cu bumps 15 or by spraying an oxidation inhibitor on the Cu bumps 15 or soaking the Cu bumps 15 into the oxidation inhibitor after the Cu bumps 15 are formed. The oxidation inhibitor could be a 5~30% sulfuric acid solution, or a 5~30% hydrofluoric acid solution, or the likes. The oxidization layer may be directly removed off the top surfaces of the Cu bumps 15 with a diamond scraper or by way of chemical mechanical polishing (CMP) after the Cu bumps 15 are formed, and the co-planarity and surface roughness of the Cu bumps 15 can also be controlled at the same time.

In comparison to the conventional method using the Au bumps, the Cu bumps 15 of the present embodiment could be formed in the packaging process, which decreases the cost and provides suitable physical and electrical performance in a compression process (coupled to the glass substrate) when applied to products.

Second Embodiment

Figure 2:
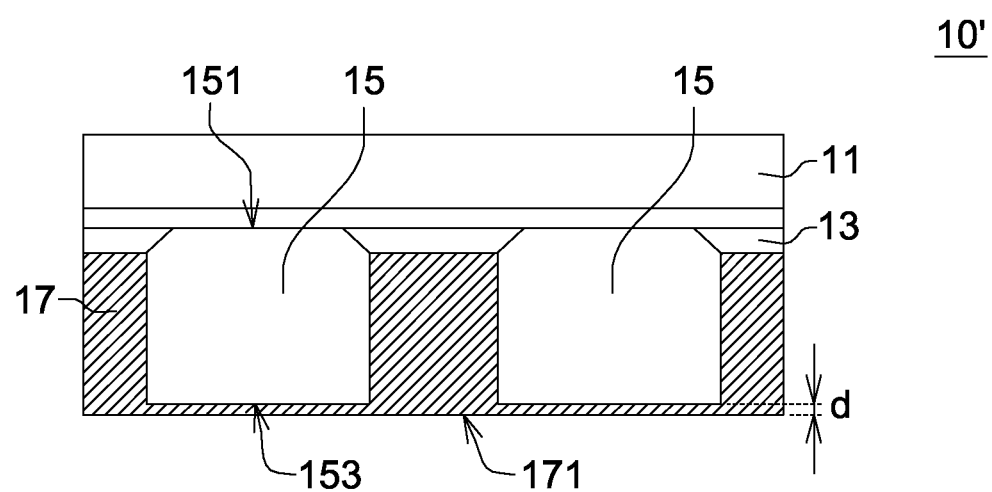
FIG. 2 shows a schematic diagram of an IC chip package according to the second embodiment of the invention.

Referring to FIG. 2, a schematic diagram of an IC chip package according to the second embodiment of the invention is shown. The IC chip package 10' of the second embodiment and the IC chip package 10 of the first embodiment both include an IC chip 11 and plural Cu bumps 15 disposed on the circuit surface 13, but the IC chip package 10' of the second embodiment further includes a nonconductive film (NCF) 17 formed on the circuit surface 13. The NCF 17 covers the Cu bumps 15, such that the Cu bumps 15 are not exposed, hence avoiding copper oxidation and copper ions migration. As indicated FIG. 2, the NCF 17 covering the Cu bumps 15 preferably has a flat surface 171 separated from the top surfaces 153 of the Cu bumps 15 by a distance d.

Like the first embodiment, the Cu bumps of the present embodiment are formed by pure copper with more than 99% of a total mass or formed with a copper component more than 90% of a total mass. Besides, the Cu bumps of the second embodiment may be formed by an alloy or a multi-layered structure whose copper component is 30 wt %~100 wt % of a total mass. When the Cu bumps are realized by a Cu/Ni/Au multi-layered structure, the thickness of the Cu/Ni/Au multi-layered structure is such as 9/1/4 μm or 9/1/2 μm or 7/1/4 μm, or other ratios.

In the second embodiment, the Cu bumps 15 are covered by an NCF 17 used as a protection film which avoids copper oxidation and copper ions migration and at the same time extends the storage life of the Cu bumps 15 (i.e. the period between shipment and compression of the IC chip package).

In an embodiment, the NCF 17 is formed by a weak acid or weak alkaline substance to avoid copper oxidation, and a pH value of the NCF 17 ranges between 4~6.5 or 7.5~10.

In an embodiment, the NCF 17 is formed by such as a base resin whose grain size ranges between 0.05 nm~500 nm. The base resin resists the infiltration and corrosion of the moisture in the air and also avoids copper oxidation.

In an embodiment, to prevent halide ions (halide such as chlorine ions or bromine ions) from eroding the Cu bumps and prevent halide ions from being combined with copper to form an erosion component which may damage the metal circuits (Al electrodes) disposed on the IC board, an ion capturing substance, such as NaOH or Ca(OH)$_2$ with 20 ppm~5% of hydroxyl ion (OH$^-$), could be added to the NCF 17. Thus, free hydroxyl ion (OH$^-$) may capture free copper ions and halide ions to prevent copper ions from being migrated or being eroded by halide ions.

In an embodiment, to prevent halide ions (halide such as chlorine ions, or bromine ions) from eroding the Cu bumps, the halide ion concentration of the NCF 17 could be controlled to be under 20 ppm (0~20 ppm). Due to measurement error, the halide ion concentration of the NCF is under 2 ppm in another embodiment.

In an embodiment, the NCF 17 may comprise polymer such as 30~40% of base resin, 50~60% of filler silica, 2~10% of dilution epoxy, and an ion capturing substance such as 20 ppm~5% of sodium hydroxide (NaOH) or calcium hydroxide (Ca(OH)$_2$).

Figure 3A:
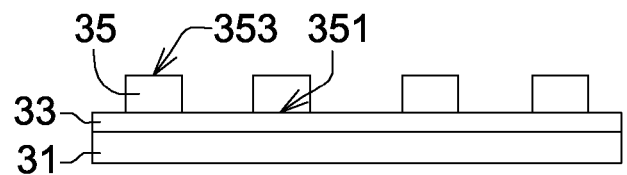
FIG. 3A~FIG. 3G shows a flowchart of manufacturing an IC chip package according to the second embodiment of the invention.

FIG. 3A~FIG. 3G show a flowchart of manufacturing an IC chip package according to the second embodiment of the invention. As shown in FIG. 3A, a wafer 31 having a circuit surface 33 is provided, wherein plural Cu bumps 35 are formed on the circuit surface 33, and the bottom surfaces 351 of the Cu bumps 35 contact the circuit surface 33. Based on actual needs, the surface of wafer 31 may be flattened (such as by photoresist), and a grinding process may be performed on the back side of the wafer 31. For example, a diamond grinding wheel is used for performing mechanical grinding processes twice, including a coarse grinding process and a fine grinding process, on the back side of the wafer 31.

Figure 4A:
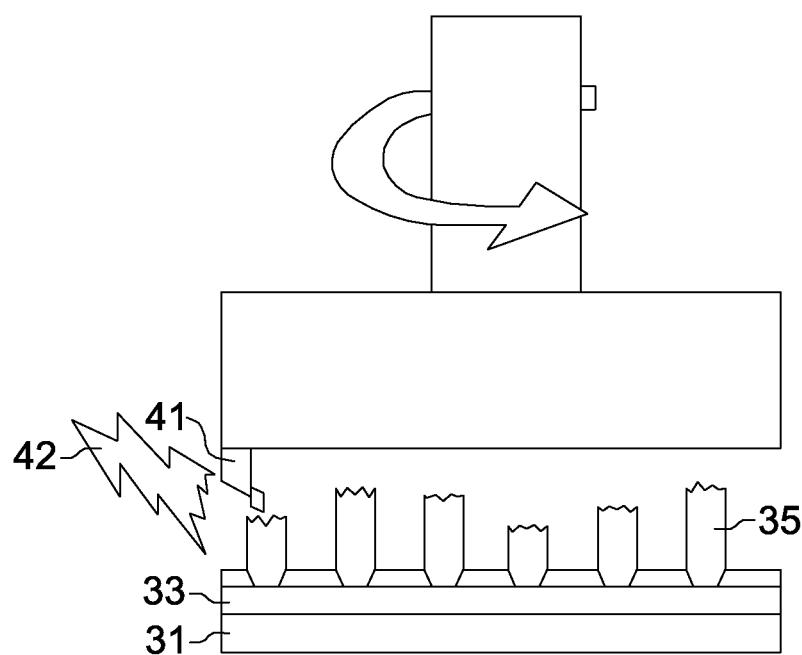
FIG. 4A shows a schematic diagram of performing a mechanical treatment on a top surface of the Cu bumps with a diamond scraper.
Figure 4B:
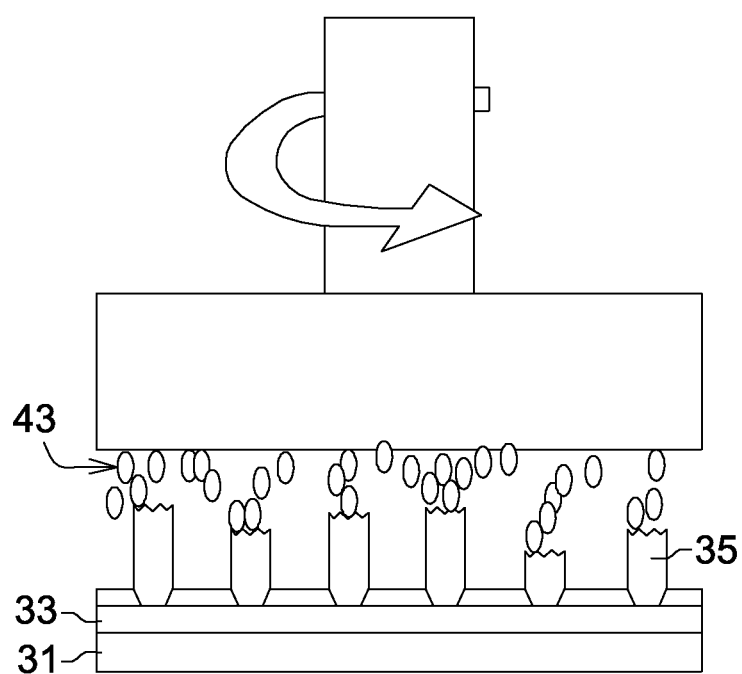
FIG. 4B a schematic diagram of performing a mechanical treatment on a top surface of the Cu bumps by way of chemical mechanical polishing.

In an embodiment, after the Cu bumps 35 are formed, the top surface of the Cu bumps 35 is mechanically treated with a diamond scraper 41 (combined with pure water 42 as indicated FIG. 4A) or by way of chemical mechanical polishing (CMP) (using a CMP slurry 43 formed by serum and abrasive grains as indicated FIG. 4B), not only removing the oxidization layer generated after the Cu bumps 35 are grown for a while, but further controlling the surface roughness and co-planarity of the Cu bumps.

Figure 3B:
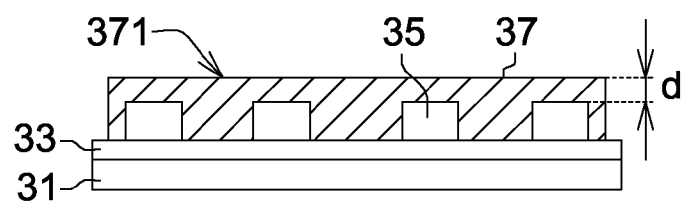

Next, as shown in FIG. 3B, an NCF 37 is formed on the circuit surface 33 to cover the Cu bumps 35. The present step may be implemented by way of spin coating. That is, the NCF 37 is uniformly coated on the Cu bumps 35 by a centrifugal force of the spin coating. The NCF 37 may also be formed by way of film taping using a glue tape. The NCF 37 covering the Cu bumps 35 has a flat surface 371 separated from the top surfaces 353 of the Cu bumps 35 by a distance d.

Figure 3C:
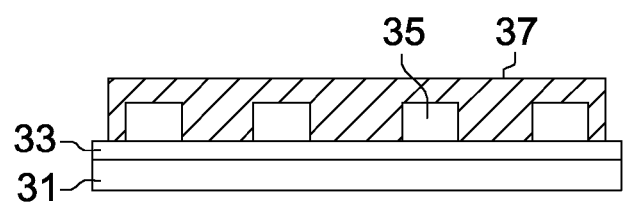

Then, as shown in FIG. 3C, a baking step is selectively performed to solidify (cure) and stabilize the NCF 37.

Figure 3D:
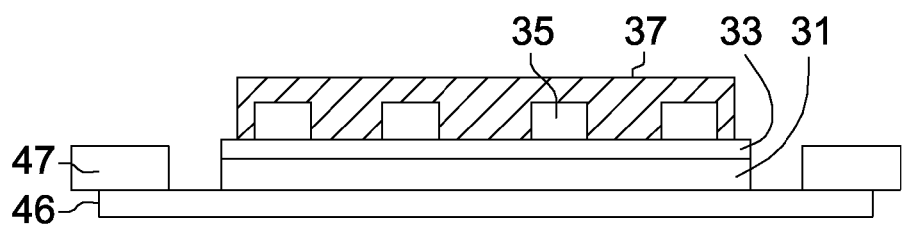

Then, as shown in FIG. 3D, a wafer mounting step is performed. A glue tape 46 is attached onto the back side of the wafer and then the wafer is placed on the frame (formed by iron, steel or copper) 47 such that the wafer 46 and the frame 47 are bonded together.

Figure 3E:
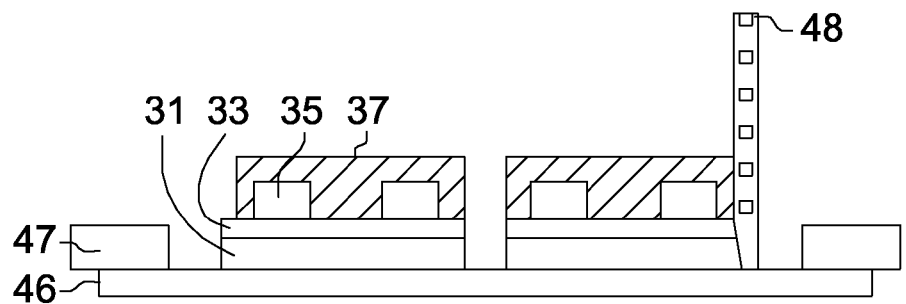

Then, as shown in FIG. 3E, the wafer disposed on the frame 47 is conveyed to the dicing platform of the wafer dicing machine 48 to be fastened and singulated. After the wafer is singulated, plural IC chip structures 10 are orderly arranged on the glue tape 46 one by one.

Figure 3F:
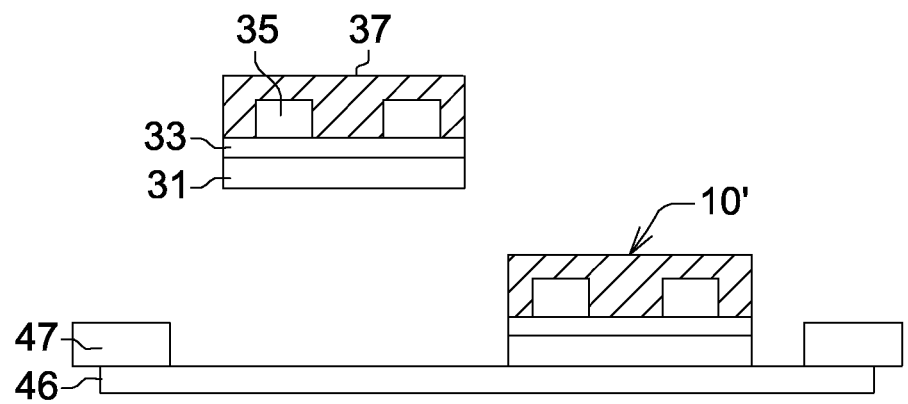
Figure 3G:
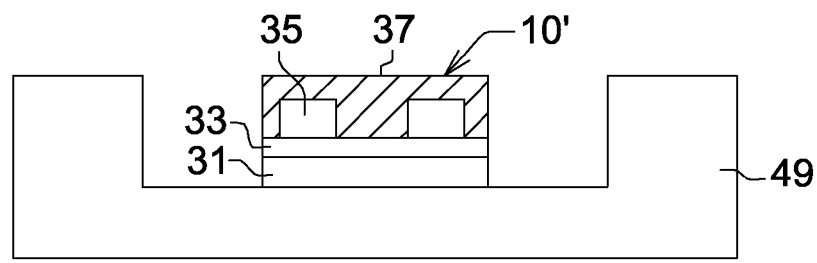

Then, as shown in FIG. 3F, the IC chip structures 10 are separated and picked up, and then are loaded in the wafer tray 49 as shown in FIG. 3G.

In the second embodiment, the NCF 37 covers the Cu bumps 35, and the wafer 31 is coated with the NCF 37 as a protection film. For the wafer to be precisely singulated (FIG. 3E), the NCF 37 is preferably translucent, transparent or at least partly transparent, such that the alignment lens may easily identify the alignment marks (such as alignment metal) on the wafer 31. Similarly, for the convenience of performing the steps illustrated in FIG. 3D, FIG. 3F and FIG. 3G, the NCF 37 is preferably transparent or at least partly transparent or translucent.

Figure 5A:
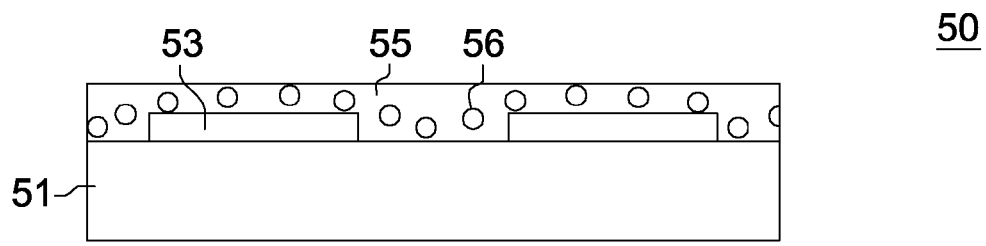
FIG. 5A~FIG. 5C show a flowchart of coupling the IC chip package of the second embodiment of the invention to a glass substrate.
Figure 5B:
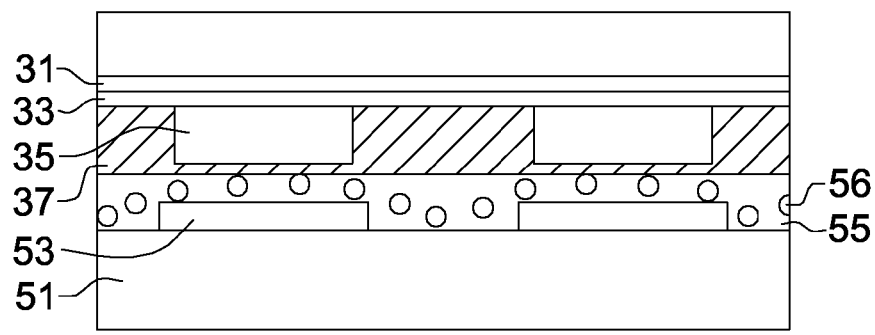
Figure 5C:
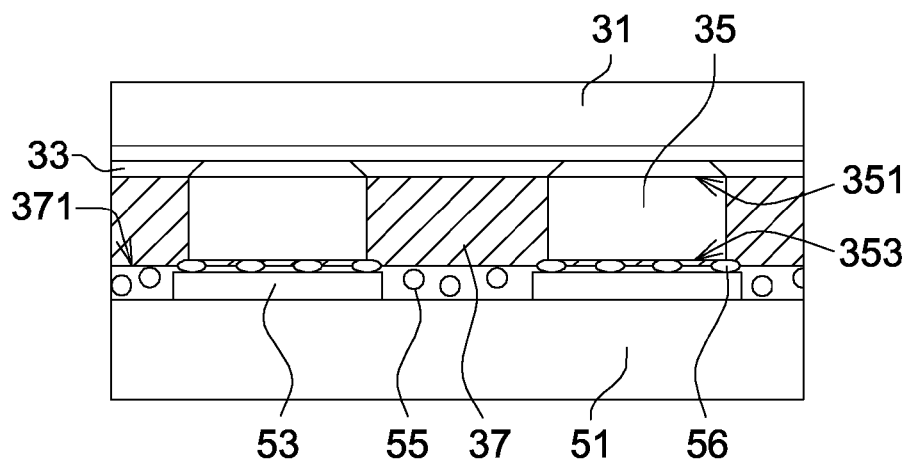

FIG. 5A~FIG. 5C show a flowchart of coupling the IC chip package 10' of the second embodiment of the invention to a glass substrate. Firstly, as shown in FIG. 5A, a panel component 50 is provided. The panel component 50 includes a glass substrate 51, plural Al electrodes 53 formed on the glass substrate 51, and a conductive film 55 formed on the glass substrate 51. The conductive film 55, realized by an anisotropic conductive film (ACF) coated on the glass substrate 51, covers the Al electrodes 53 and contains a number of conductive particles 56.

It is noted that the commonly used structure of the ACF is a double-layered conductive film structure formed by stacking a nonconductive layer (NCF) and a conductive layer (such as an ACF) together. When the IC chip package 10' already having an NCF 37 is bonded to the glass substrate 51, the conductive film 55 on the Al electrodes 53 may be realized by a single-layered conductive film structure (instead of using a double-layered ACF having an NCF).

Then, as shown in FIG. 5B, the Cu bumps 35 of the IC chip package 10' of the second embodiment are aligned with the Al electrodes 53 of the panel component 50 and are selectively pre-taped (such as initial baking) to temporarily fasten the IC.

As shown in FIG. 5C, a baking step is performed to fasten the IC chip package 10' and the panel component 50, such that the top surfaces 353 of the Cu bumps 35 of the IC chip package 10' are electrically connected to the Al electrodes 53 of corresponding panel component 50 via a part of the conductive particles 56 inside the conductive film 55 to complete the assembly process of the IC chip package 10' and the panel component 50. After the IC chip package 10' and the panel component 50 are assembled, conductive particles 56 which electrically connect the Cu bumps 35 to the Al electrodes 53 penetrate the surface of the NCF 37.

As disclosed above, for the wafer to be precisely singulated (FIG. 3D-FIG. 3F), the NCF 37 is preferably translucent, transparent or at least partly transparent. Similarly, in the alignment process (as shown in FIG. 5B), for the Cu bumps 35 of the IC chip package 10 to be precisely aligned with the Al electrodes 53 disposed on the glass substrate 51, the NCF 37 coated on the chip is preferably transparent, at least partly transparent or translucent, such that the alignment lens may identify the alignment marks (such as an alignment metal) on the wafer.

Besides, in the process of assembling the IC chip package 10' with the panel component 50 as shown in FIG. 5C, when the conductive film (such as an ACF) 55 is compressed, the conductive particles 56 flowing inside the conductive film will be affected by the change of the viscosity of the NCF 37.

Figure 6A:
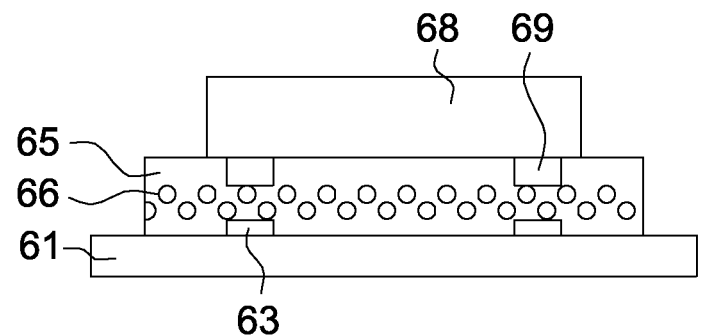
FIG. 6A-FIG. 6C are schematic diagrams showing conductive particles flowing in the conductive film when the bumps not covered by an NCF is assembled with a panel component.
Figure 6B:
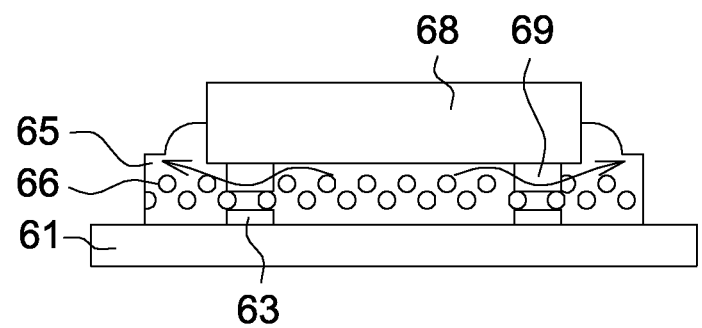
Figure 6C:
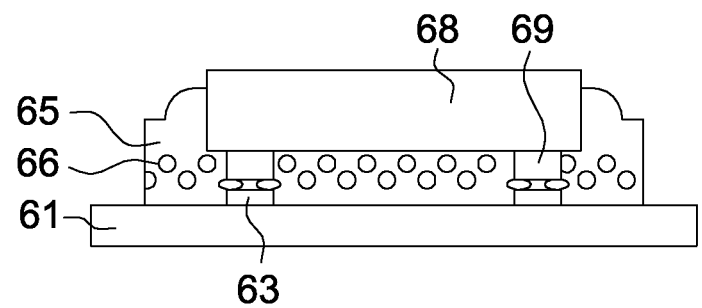

FIG. 6A-FIG. 6C are schematic diagrams showing conductive particles flowing in the conductive film when the bumps not covered by an NCF are assembled with a panel component. In the process of assembling the bumps 69 not covered by an NCF with a panel component (such as a glass substrate 61, plural Al electrodes 63, and a conductive film 65 containing a number of conductive particles 66) as shown in FIG. 6A, the conductive film (such as an ACF) 65 is compressed. Since the bumps 69 are not covered by an NCF, the conductive particles 66 within the compressed conductive film 65 will not flow too fast (the flow directions are denoted by the arrows as indicated in FIG. 6B), and the number of conductive particles 66 captured by the bumps 69 and the Al electrodes 63 will not be too little (FIG. 6C) after assembly.

Figure 7A:
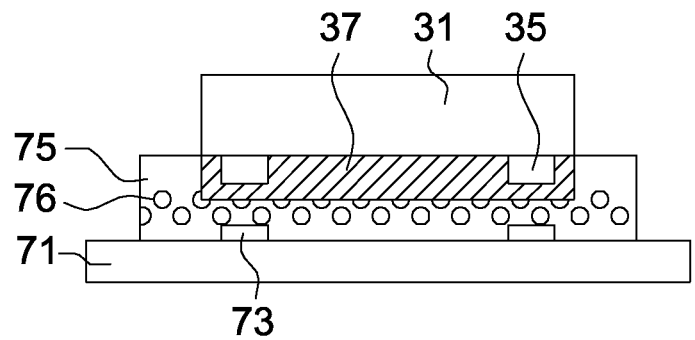
FIG. 7A-FIG. 7C are schematic diagrams showing conductive particles flowing in the conductive film when the bumps covered by an NCF of an embodiment of the invention is assembled with a panel component.
Figure 7B:
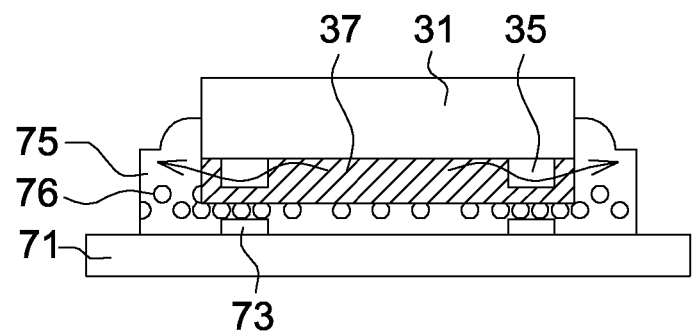
Figure 7C:
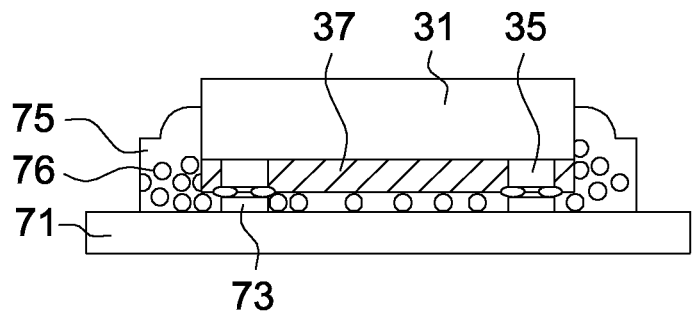

FIG. 7A-FIG. 7C are schematic diagrams showing conductive particles flowing in the conductive film when the bumps covered by an NCF is assembled with a panel component (such as a glass substrate 71, plural Al electrodes 73, and a conductive film 75 containing a number of conductive particles 76). Typically, the hardness of the Cu bumps 35 disposed on the IC chip 31 is more than 80 HV or 100 HV, approximately. In the process of assembling the Cu bumps 35 with a panel component (FIG. 7A), the conductive film (such as an ACF) 75 is compressed. Since the NCF 37 covering the Cu bumps 35 occupies some space for the flow of the conductive particles, the flowing speed of the conductive particles will be affected (the flow directions are denoted by arrows as indicated in FIG. 7B), and the conductive particles 76 within the conductive film 75 will flow faster during to the compression, and the number of conductive particles 76 captured by the Cu bumps 35 and the Al electrodes 73 after assembly will be too little (FIG. 7C).

Figure 8:
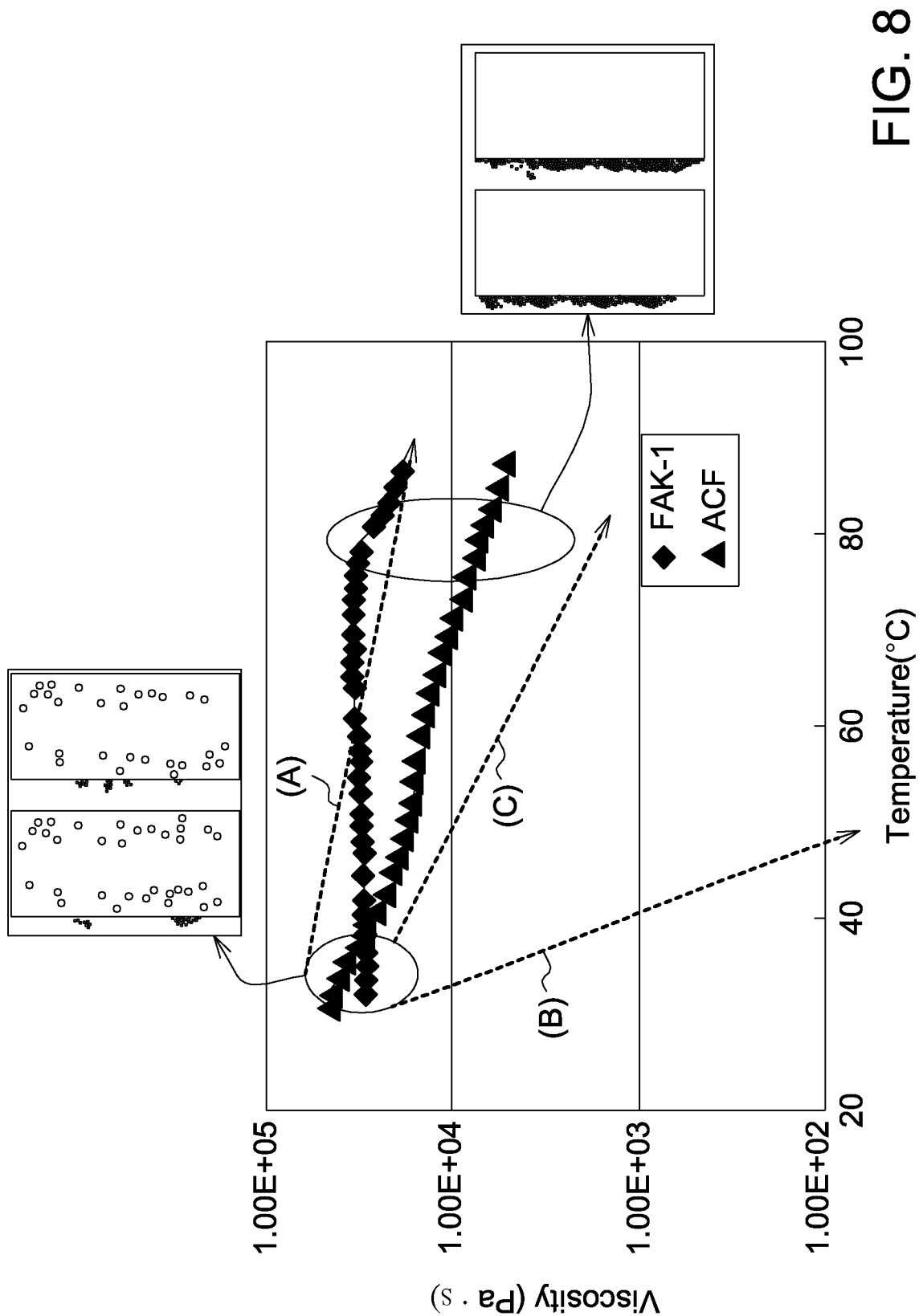
FIG. 8 shows viscosity vs. temperature relationships for an NCF and a conductive film (ACF)

Referring to FIG. 8, viscosity vs. temperature relationships for an NCF and a conductive film (ACF) are shown. In an embodiment, the NCF coordinates with the temperature dependence of the conductive film ACF. As indicated in the viscosity vs. temperature curve of the conductive film ACF of FIG. 8, the viscosity coefficient of the NCF ranges between $-0.3$ KPa·S/° C. (the slope of the optimal straight line A) and $-8$ KPa·S/° C. (the slope of the optimal straight line B). The viscosity vs. temperature curve of the conductive film ACF is denoted by the symbol ▲, the viscosity vs. temperature curve of an NCF is denoted by the symbol ♦, and when the temperature is increased by 1° C., the viscosity is decreased by 0.3~8 K Pa·S. When the viscosity coefficient of the NCF is greater than $-0.3$ KPa·S/° C. or smaller than $-0.3$ KPa·S/° C., fewer conductive particles are captured on the Cu bumps and the number of the captured conductive particles may even be less than 2. However, when the viscosity coefficient of the NCF is in an interval between $-0.3$ KPa·S/° C. and $-8$ KPa·S/° C., the number of the conductive particles captured on the Cu bumps increases significantly, and the number of captured conductive particles may even be more than 20. In another embodiment, the viscosity coefficient of the NCF is selectively determined within an interval between $-4$ KPa·S/° C. (the optimal slope of straight line C) and $-5$ KPa·S/° C., the number of conductive particles 76 electrically connecting the Cu bumps 35 with the Al electrodes 73 is in a range of about 2~200 in an embodiment, and is about 3~30 in another embodiment.

In the first embodiment and the second embodiment, whether the Cu bumps are covered by an NCF 37 or not, in the process of forming the Cu bumps, a treatment of removing the oxidization layer or inhibiting the growth of the oxidization layer is optionally performed on the top surfaces of the Cu bumps. The top surfaces are the contact surfaces when the Cu bumps are bonded to the electrodes of the panel component. In greater details, in the process of forming the Cu bumps, nitrogen is purged to evacuate oxygen and inhibit the growth of the oxidization layer. Alternatively, after the Cu bumps are formed, the oxidization layer may be directly removed off the top surfaces of the Cu bumps with a diamond scraper or by way of chemical mechanical polishing.

Figure 9A:
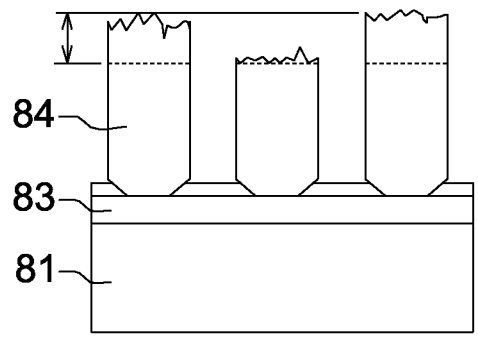
FIG. 9A shows the situation that the Cu bumps initially formed on a circuit surface of the IC chip may have uneven surfaces or unequal heights.
Figure 9B:
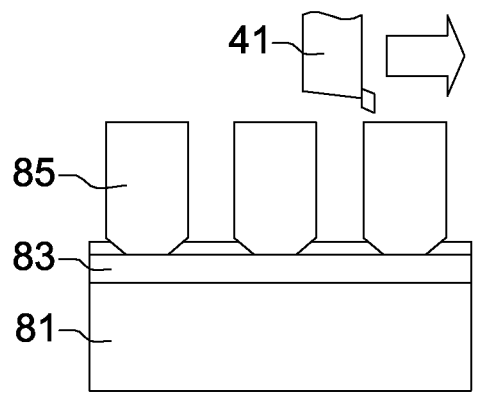
FIG. 9B shows that the treated Cu bumps have excellent co-planarity after the top surfaces of the Cu bumps are mechanically treated with a diamond scraper to remove an oxidization layer.
Figure 9C:
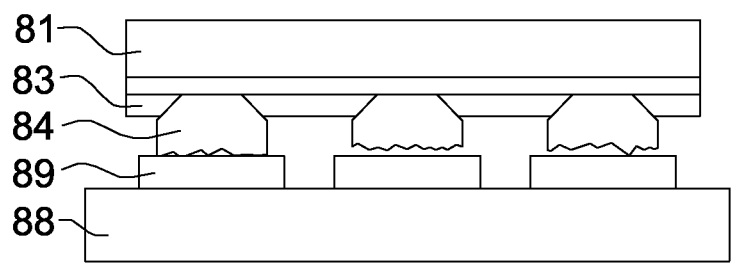
FIG. 9C shows that the subsequent process of coupling the Cu bumps to a panel component would be affected if the Cu bumps have uneven surfaces or unequal heights.

FIG. 9A shows the situation that the Cu bumps 84 initially formed on a circuit surface 83 of the IC chip 81 may have uneven surfaces or unequal heights. FIG. 9B shows that the treated Cu bumps 85 have excellent co-planarity after the top surfaces of the Cu bumps 84 are mechanically treated with a diamond scraper 41 to remove an oxidization layer. FIG. 9C shows a process of coupling the Cu bumps 84 having uneven surfaces or unequal heights to a panel component. In the present embodiment, through mechanical treatment, the co-planarity and surface roughness of the Cu bumps are well controlled, such that the Cu bumps and a panel component (such as the Al electrodes 89 disposed on the glass substrate 88) can be well bonded.

It is noted that if the surface roughness of the Cu bumps 85 is too large (such as >2 um), in a compression process (as shown in FIG. 5B-FIG. 5C), the conductive particles may end up with poor contact or excessively small effective number. If the surface roughness is too small (such as <0.05 um), in a compression process (as shown in FIG. 5B~FIG. 5C), the conductive particles may end up with poor contact due to insufficient grip or even may slip off the Cu bumps. The surface roughness of the Cu bumps 85 ranges between 0.05 µm~2 µm in an embodiment, and ranges between 0.8 µm~1.2 µm in another embodiment.

To summarize, the cost can be reduced by replacing Au bumps with Cu bumps. As the Cu bumps are formed in the packaging process, suitable physical and electrical performances are produced in a compression process (coupling to the glass substrate). In an embodiment, an NCF covers the Cu bumps to avoid copper oxidation and copper ions migration, and at the same time, extend the storage life of the Cu bumps 15 (the period between shipment and compression of the IC chip package), simplify the conductive film (such as an ACF) structure of the glass substrate (the conductive film originally being a double-layered structure, including a nonconductive film and a conductive film stacked, could be replaced by a single-layered conductive film), and reduce the cost of the conductive film (such as an ACF). Moreover, specific ingredients may be added to the NCF to avoid the Cu bumps being oxidized and copper ions being migrated. Moreover, through the combination of the physical properties (such as viscosity) of the NCF and the properties of the conductive film (such as an ACF), the Cu bumps may be well-electrically connected to the glass substrate, and the process as described in the embodiment is suitable for mass production. Besides, the method of singulating the wafer and picking up the IC chips with Cu bumps are applicable for controlling the deformation and peeling of the material of the NCF used as a protection film, thereby obtaining the chips with good quality after wafer singulation. Despite the disclosure is elaborated in a number of embodiments disclosed above, different embodiments may be combined in practical applications.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An IC chip package, comprising:
an IC chip having a circuit surface; and
a plurality of copper (Cu) bumps whose bottom surfaces directly contact the circuit surface, wherein a surface roughness of the Cu bumps is in a range of 0.05 µm to 2 µm.

2. The IC chip package according to claim 1, further comprising a nonconductive film (NCF) formed on the circuit surface, wherein the NCF is translucent and covers the Cu bumps.

3. The IC chip package according to claim 2, wherein the NCF covering the Cu bumps has a flat surface separated from the top surfaces of the Cu bumps by a distance.

4. The IC chip package according to claim 2, wherein the NCF is a transparent nonconductive film.

5. The IC chip package according to claim 2, wherein the NCF comprises base resin having a grain size in a range of 0.05 nm to 500 nm.

6. The IC chip package according to claim 2, wherein the NCF comprises weak acid or weak alkaline substance, and a pH value of the NCF is in a range of 4~6.5 or 7.5~10.

7. The IC chip package according to claim 2, wherein the NCF comprises 20 ppm to 5% of hydroxyl ion (OH—).

8. The IC chip package according to claim 2, wherein the NCF comprises sodium hydroxide (NaOH) or calcium hydroxide (Ca(OH)2).

9. The IC chip package according to claim 2, wherein the NCF comprises less than 20 ppm of halide ions.

10. The IC chip package according to claim 2, wherein the NCF comprises less than 2 ppm of halide ions.

11. The IC chip package according to claim 2, wherein a viscosity coefficient of the NCF ranges between −0.3 KPa·S/° C. and −8 KPa·S/° C.

12. The IC chip package according to claim 2, wherein a viscosity coefficient of the NCF ranges between −4 KPa·S/° C. and −5 KPa·S/° C.

13. The IC chip package according to claim 1, wherein a hardness of the Cu bumps is greater than 80 HV.

14. The IC chip package according to claim 1, wherein a surface roughness of the Cu bumps ranges between 0.8~1.2 µm.

15. The IC chip package according to claim 1, wherein the Cu bumps are realized by an alloy or a multi-layered structure, and a copper component of the Cu bumps is 30 wt % to 100 wt % of a total mass.

16. The IC chip package according to claim 15, wherein the Cu bumps are realized by a Cu/Ni/Au multi-layered structure.

17. The IC chip package according to claim 1, wherein a copper component of the Cu bumps is more than 90 wt % of a total mass.

18. The IC chip package according to claim 1, wherein the Cu bumps are formed by pure copper with more than 99 wt % of a total mass.

19. A chip-on-glass structure, comprising:
an IC chip package, comprising:
an IC chip having a circuit surface; and
a plurality of copper (Cu) bumps whose bottom surfaces directly contact the circuit surface;
a glass substrate supporting the IC chip package;
a plurality of aluminum (Al) electrodes formed on the glass substrate; and
a conductive film formed on the glass substrate and covering the Al electrodes, wherein the conductive film comprises a plurality of conductive particles, and
top surfaces of the Cu bumps of the IC chip package being electrically connected to the corresponding Al electrodes via a part of the conductive particles.

20. The chip-on-glass structure according to claim 19, wherein the conductive film is a single-layered conductive adhesive.

21. The chip-on-glass structure according to claim 19, wherein the conductive film is an anisotropic conductive film (ACF), and the ACF is a stacking structure comprising a nonconductive layer and a conductive layer.

22. The chip-on-glass structure according to claim 19, wherein the IC chip package further comprises a nonconductive film (NCF) which is formed on the circuit surface and covers the Cu bumps, and the conductive particles of the conductive film penetrate a surface of the NCF to electrically connect the Cu bumps to the Al electrodes.

23. The chip-on-glass structure according to claim 22, wherein about 2~200 of the conductive particles electrically connect the Cu bumps to the Al electrodes.

24. The chip-on-glass structure according to claim 22, wherein about 3~30 of the conductive particles electrically connect the Cu bumps to the Al electrodes.

25. An IC chip package, comprising:
an IC chip having a circuit surface;
a plurality of Cu bumps whose bottom surfaces directly contact the circuit surface, wherein the Cu bumps are realized by an alloy or a multi-layered structure, and a copper component of the Cu bumps is 30 wt %~100 wt % of a total mass of the Cu bumps, wherein a surface roughness of the Cu bumps is in a range of 0.05 μm to 2 μm; and
a nonconductive film (NCF) formed on the circuit surface, wherein the NCF covers the Cu bumps and is translucent.

26. The IC chip package according to claim 25, wherein the NCF is a transparent NCF.

27. The IC chip package according to claim 25, wherein the Cu bumps are a Cu/Ni/Au multi-layered structure.

28. The IC chip package according to claim 25, wherein a copper component of the Cu bumps is more than 90 wt % of a total mass.

29. The IC chip package according to claim 25, wherein the Cu bumps is a pure copper in more than 99 wt % of a total mass.

30. The IC chip package according to claim 25, wherein a hardness of the Cu bumps is greater than 80 HV.

31. A chip-on-glass structure, comprising:
an IC chip package, comprising:
an IC chip having a circuit surface; and
a plurality of copper (Cu) bumps whose bottom surfaces directly contact the circuit surface;
a glass substrate supporting the IC chip package;
a plurality of Al electrodes formed on the glass substrate; and
a conductive film formed on the glass substrate and covering the Al electrodes, wherein the conductive film comprises a plurality of conductive particles,
wherein top surfaces of the Cu bumps of the IC chip package are electrically connected to the corresponding Al electrodes via a part of the conductive particles.

32. The chip-on-glass structure according to claim 31, wherein the conductive film is a single-layered conductive adhesive.

33. The chip-on-glass structure according to claim 32, wherein the NCF of the IC chip package is formed on the circuit surface and covers the Cu bumps, and the conductive particles of the conductive film penetrate a surface of the NCF to electrically connect the Cu bumps to the Al electrodes.

* * * * *